United States Patent
Roberts et al.

(10) Patent No.: US 9,526,320 B2
(45) Date of Patent: Dec. 27, 2016

(54) CASE FOR A MOBILE DEVICE WITH A SCREEN

(71) Applicant: Tech 21 Licensing Limited, Twickenham (GB)

(72) Inventors: Jason Roberts, Twickenham (GB); Wilhelm Marschall, Twickenham (GB); Benjamin Thorpe, Twickenham (GB)

(73) Assignee: TECH 21 LICENSING LIMITED, Middlesex (GB)

( * ) Notice: Subject to any disclaimer, the term of this patent is extended or adjusted under 35 U.S.C. 154(b) by 0 days.

(21) Appl. No.: 14/586,256

(22) Filed: Dec. 30, 2014

(65) Prior Publication Data

US 2015/0195929 A1  Jul. 9, 2015

(30) Foreign Application Priority Data

Jan. 3, 2014  (GB) .................................. 1400079.8

(51) Int. Cl.
*H05K 5/00* (2006.01)
*A45F 5/00* (2006.01)
(Continued)

(52) U.S. Cl.
CPC ................. *A45F 5/00* (2013.01); *A45C 11/00* (2013.01); *H04B 1/3888* (2013.01);
(Continued)

(58) Field of Classification Search
CPC ...... A45F 5/00; A45C 11/00; A45C 2011/002; A45C 2011/003
(Continued)

(56) References Cited

U.S. PATENT DOCUMENTS

| 6,003,052 A | 12/1999 | Yamagata |
| 2008/0282876 A1* | 11/2008 | Leivesley ................ A62D 5/00 89/36.02 |

(Continued)

FOREIGN PATENT DOCUMENTS

| GB | 2480450 | 11/2011 |
| GB | 2496610 | 5/2013 |

(Continued)

OTHER PUBLICATIONS

Webster's Revised Unabridged Dictionary, "Pitch," 1913, C. & G. Merriam Co., Springfield, Mass., Under the direction of Noah Porter, D.D., LL.D.*

(Continued)

*Primary Examiner* — Gwendolyn Blackwell
*Assistant Examiner* — Kevin Ortman, Jr.
(74) *Attorney, Agent, or Firm* — Stephen J. Weyer, Esq.; Stites & Harbison, PLLC

(57) ABSTRACT

A case for a mobile device with a screen, the case comprising a band arranged to surround the edge of the device. The band comprises a layer of flexible polymer (1) and a layer of a damping material (3) which is softer than the flexible polymer provided within the flexible polymer layer. The damping material (3) has a plurality of protrusions (2) projecting inwardly from a substantial portion of the inner periphery of the band to engage with the device. The protrusions are arranged such that, in normal use there is substantially no contact between the band and the device other than through the protrusions.

14 Claims, 2 Drawing Sheets

(51) Int. Cl.
*H04B 1/3888* (2015.01)
*A45C 11/00* (2006.01)

(52) U.S. Cl.
CPC ...... *H05K 5/0086* (2013.01); *A45C 2011/002* (2013.01); *A45C 2011/003* (2013.01); *Y10T 428/1352* (2015.01)

(58) Field of Classification Search
USPC ..................................... 428/35.3, 35.5, 35.7
See application file for complete search history.

(56) References Cited

U.S. PATENT DOCUMENTS

| | | | |
|---|---|---|---|
| 2010/0104814 | A1 | 4/2010 | Richardson et al. |
| 2012/0037536 | A1 | 2/2012 | Lonsdale, II et al. |
| 2012/0110868 | A1 | 5/2012 | Abbondanzio |
| 2012/0211168 | A1 | 8/2012 | Patel et al. |
| 2012/0211171 | A1 | 8/2012 | Patel et al. |
| 2012/0325720 | A1 | 12/2012 | Tages et al. |
| 2013/0020005 | A1 | 1/2013 | Koblick et al. |
| 2013/0020020 | A1 | 1/2013 | Liu |
| 2013/0193006 | A1* | 8/2013 | Bergreen ............... A45C 11/22 206/37 |
| 2013/0292269 | A1 | 11/2013 | Tages et al. |
| 2015/0000831 | A1 | 1/2015 | Wang |

FOREIGN PATENT DOCUMENTS

| | | |
|---|---|---|
| KR | 101103436 | 1/2012 |
| KR | 101135144 | 4/2012 |
| KR | 1020120047576 | 5/2012 |
| KR | 101335762 | 12/2013 |

OTHER PUBLICATIONS

European Search Report dated May 29, 2014 in corresponding GB Application No. 1400079.8.
European Search Report dated Jun. 5, 2014 in corresponding GB Application No. 1400080.6.
European Search Report dated Jun. 16, 2014 in corresponding GB Application No. 1400082.2.
International Search Report and Written Opinion dated Mar. 5, 2015 in corresponding International Application No. PCT/GB2014/053733.
Extended European Search Report dated Mar. 18, 2015 in corresponding European Application No. 14 198 593.7.

* cited by examiner

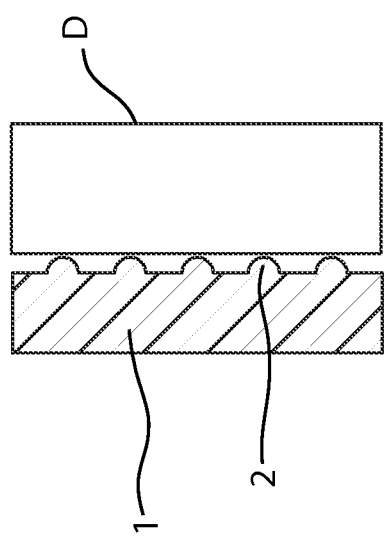
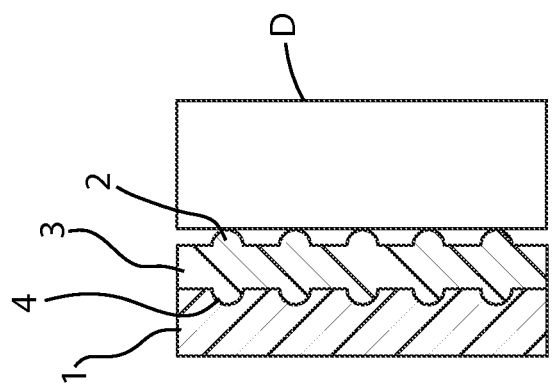
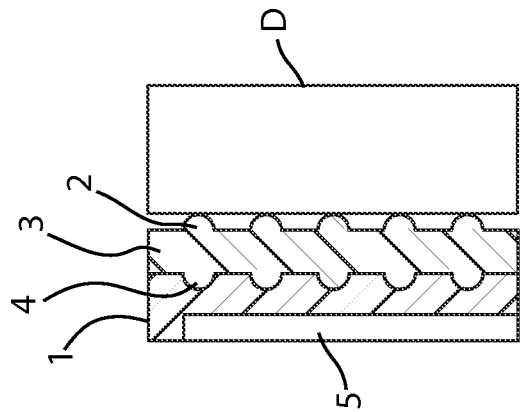

CASE FOR A MOBILE DEVICE WITH A SCREEN

The present invention relates to a case for a mobile device with a screen such as a smart phone, tablet or E-reader.

It is well known to make such cases of thermoplastic polyurethane (TPU) as this provides good durability for the case. It does not, however, provide good impact protection for the device as there is little dissipation of the impact and most of the energy of the impact is transferred to the device. Known impact resistant materials improve this to some extent.

The present invention aims to improve on this.

According to the present invention there is provided a case for a mobile device with a screen, the case comprising a band arranged to surround the edge of the device, the band comprising a layer of flexible polymer and a layer of a damping material which is softer than the flexible polymer provided within the flexible polymer layer, the damping material having a plurality of protrusions projecting inwardly from a substantial portion of the inner periphery of the band to engage with the device, wherein the protrusions are arranged so that in normal use there is substantially no contact between the band and the device other than through the protrusions.

Having protrusions in engagement with the majority of the periphery of the device reduces significantly the contact area between the device and the case to minimise energy transferred to the device. The flexible polymer outer layer absorbs impact energy and holds the shape of the case, while the softer material with the protrusions further absorbs and dissipates the remaining energy of the impact away from the device.

The contact with the protrusions may be concentrated at vulnerable regions such as the corners of the device. Portions of the longer edges, or portions of edges where plugs sockets are present may have no protrusions. Alternatively, shorter protrusions may be provided along the longer edges of the case that will not contact the device in normal use but will provide some cushioning if the longer edges of the case are deflected inwardly.

The protrusions may have a number of configurations. They may, for example be circular or annular projections extending inwardly from the band. However, it has been found that the preferred configuration is one in which the protrusions are ribs extending generally across the depth of the band and have a curved cross-section when viewed in a section taken in the plane of the device. Preferably, the curved cross-section is substantially semi-circular. Experiments have shown that such a shape can absorb and dissipate high amounts of energy.

The case may consist only of the band. However, it may also have a rear wall engaging with the back of the device. It may further include a hinged cover to protect the screen.

The interface between the two materials may be planar. However, preferably, the damping material is provided with a plurality of outwardly projecting protrusions which are imbedded in the flexible polymer.

The protrusions between the two materials improve the cushioning and greatly increase energy absorption. The protrusions may have the same configuration as the inwardly projecting ribs. However, preferably, they are ribs which are rectangular in cross-section when viewed in a section taken in the plane of the device.

In order to further enhance impact protection, a layer of material harder than the flexible polymer material (measured on the Shore A hardness scale) may be provided outside of the flexible polymer material. This provides a hard outer shell to further spread the impact.

The flexible polymer may be TPE or TPU. The softer material is preferably a viscoelastic material or an impact damping or absorbing polymer.

The protrusions are preferably relatively robust in the sense that when dropped from 7 meters onto a hard surface, the protrusions will prevent contact between the device and the material between adjacent protrusions.

This may be achieved by having relatively large ribs where, preferably, each protrusion protrudes for a depth at least 0.5 mm (more preferably 1 mm) from the band, has a width greater than the depth and a pitch between adjacent protrusions which is greater than twice the width.

Examples of cases in accordance with the present invention will now be described by reference to the accompanying drawings, in which:

FIG. 1 is a cross-section of a portion of a first case included for background interest only in contact with the device;

FIG. 2 is a similar view of a second case;

FIG. 3 is a similar view of a third case; and

FIG. 1 shows a small proportion of the case to illustrate the principle of the present invention. The whole case will run around the entire periphery of the device D.

Figure 4:
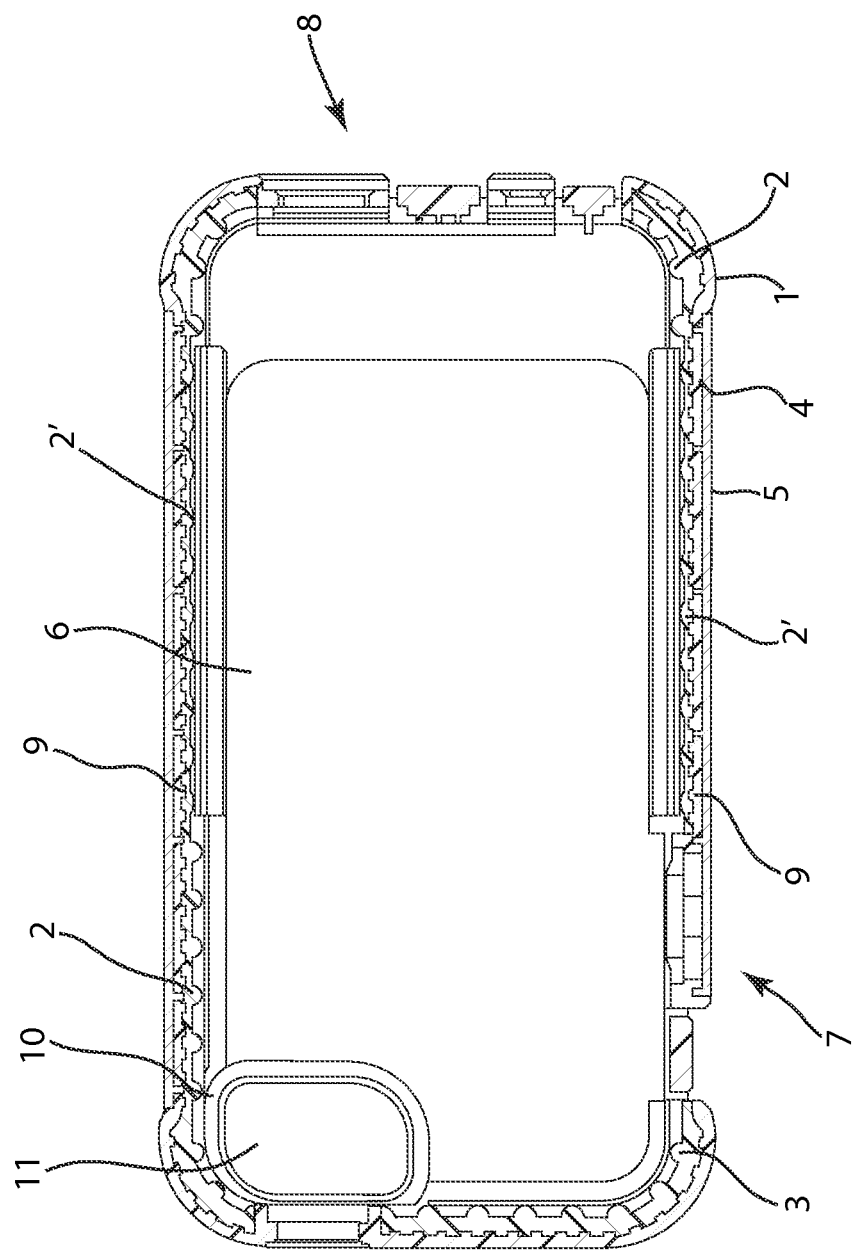
FIG. 4 is a cross-section in the plane of the device of a full case with the arrangement of FIG. 3.

The simplest design is typified in FIG. 1 which is a single material 1, in this case TPU (for example BASF Elastollan), which is provided with a number of inwardly extending ribs 2 which, as shown, have a semi-circular cross-section in the plane of the device and extend across the width of the band. The ribs in this example have a width of 2 mm, a depth of 1.5 mm and a spacing of 3 mm.

The same basic structure is observed in FIG. 2 which is in accordance with the invention, this time in a two part layer. The TPU forms the outer layer while an inner layer 3 formed in a dual injection process or as an insert mold is formed of a viscoelastic polymer which is softer than the TPU (for example, a TPE such as KRAIBURG THERMOLAST K or a PU foam such as BASF ELASTOFLEX). This time, the inwardly projecting ribs 2 are provided in the viscoelastic polymer layer 3. The viscoelastic polymer layer 3 also has a number of inwardly projecting ribs 4 which are embedded in the TPU layer 1.

The third case shown in FIG. 3 also in accordance with the invention adds to the second case of FIG. 2, a hard outer shell 5 which is a rigid polymer case (for example BAYER MAKROLON). As shown in FIG. 3, this may only be present in certain regions where higher hardness is beneficial.

The manner in which the example shown in FIG. 3 is applied to a full case is shown with reference to FIG. 4. It will be appreciated that the examples of FIGS. 1 and 2 can be applied in the same manner, in the case of FIG. 2 omitting the outer shell 5, and in the case of FIG. 1 with all of the case being formed of a single layer of thermoplastic polymer 1.

In the full case shown in FIG. 4, the TPU material 1 forms the bulk of the casing including the majority of the rear face 6. This is lined with a layer of viscoelastic polymer 3 which extends across a portion of the rear face 6 and up the sides of the majority of the case. There are regions 7 and 8 in FIG. 4 where the viscoelastic polymer is absent and the only material is the TPU so as to allow access to the buttons in the side of the device in region 7 and the ports for the charger plug and headphone jack in region 8. The ribs 2 are present particularly at the corners of the device to provide maximum cushioning in these regions. Running along the majority of each side of the case are truncated ribs 2' so that the case does not contact the device in these regions during normal use thereby further isolating the sides from impact on the screen.

The interface between the TPU 1 and viscoelastic polymer 5 has a plurality of rectangular ribs 9 protruding inwardly from the viscoelastic polymer 5. These ribs 9 have a rectangular profile in cross-section, the width of which is at least twice their depth.

The case is completed by the rigid polymer layer 5 which extends along the majority of each side of the case. There is also a ring of rigid polymer 10 surrounding an orifice 11 which provides a window for the rear facing camera, sensor and LED flash.

As can be seen from FIG. 4, the casing is designed to provide maximum cushioning in the corner regions. However, along the long side portions, the case is largely held away from the device and has enhanced rigidity afforded by the rigid polymer layer 5.

The invention claimed is:

1. A case for a substantially rectangular mobile device with a screen, the case comprising a band having four sides arranged to surround the edge of the device, the band comprising a layer of flexible polymer and a layer of a damping material which is softer than the flexible polymer provided within the flexible polymer layer, the damping material having a plurality of inwardly projecting protrusions and a plurality of outwardly projecting protrusions, wherein the plurality of inwardly projecting protrusions project inwardly from a substantial portion of the inner periphery of the band to engage with the device, wherein the protrusions are arranged such that, in normal use there is substantially no contact between the band and the device other than through the protrusions, and wherein the plurality of outwardly projecting protrusions are imbedded in the flexible polymer material along a substantial length of at least one of the four sides of the band which are to surround the edge of the device and the plurality of outwardly projecting protrusions project outwardly away from the device to be engaged by the plurality of inwardly projecting protrusions.

2. A case according to claim 1, wherein the protrusions are provided at least in the corner regions of the case.

3. A case according to claim 1, wherein there are no protrusions, or shorter protrusions along portions of the longer edges of the case such that the case will not contact the device in these regions in normal use.

4. A case according to claim 1, wherein the protrusions are ribs extending generally across the depth of the band and have a curved cross-section when viewed in a section taken in the plane of the device.

5. A case according to claim 4, wherein the curved cross-section is substantially semi-circular.

6. A case according to claim 1, wherein the outwardly projecting protrusions are ribs which are rectangular in cross-section when viewed in a section taken in the plane of the device.

7. A case according to claim 1, wherein a layer of material harder than the flexible polymer material is provided outside of the flexible polymer material.

8. A case according to claim 1, wherein the flexible polymer layer has a Shore A hardness range of 70 to 90.

9. A case according to claim 1, wherein the layer of damping material has a Shore A hardness range of 0 to 70.

10. A case according to claim 7, wherein the layer of material harder than the flexible polymer material has a hardness range of 75 Shore A to 85 Shore D.

11. A case according to claim 1, wherein the protrusions are robust enough, so that, when dropped from 7 meters onto a hard surface, the protrusions will prevent contact between the device and the material between adjacent protrusions.

12. A case according to claim 1, wherein each protrusion protrudes for a depth at least 0.5 mm from the band, has a width greater than the depth and a pitch between adjacent protrusions which is greater than twice the width.

13. A case according to claim 12, wherein the depth of each protrusion is at least 1 mm.

14. The case according to claim 1, wherein the substantial length of at least one of the four sides having the plurality of outwardly projecting protrusions project outwardly, is an entire length of at least one of the four sides of the band.

* * * * *